US005569925A

United States Patent [19]

Quinn et al.

[11] Patent Number: 5,569,925

[45] Date of Patent: Oct. 29, 1996

[54] MECHANICAL SHUTTER FOR PROTECTING AN X-RAY DETECTOR AGAINST HIGH-ENERGY ELECTRON OR X-RAY DAMAGE

[75] Inventors: Duncan R. Quinn, Ridgewood; Brian W. Gallagher, Highland Lakes; Costas Blionas, Hackensack, all of N.J.; Joseph A. Nicolosi, Bardonia, N.Y.

[73] Assignee: Philips Electronics North America Corporation, New York, N.Y.

[21] Appl. No.: 264,395

[22] Filed: Jun. 23, 1994

[51] Int. Cl.$^{6}$ .................................................. H01J 37/244

[52] U.S. Cl. ....................................... 250/370.06; 250/397

[58] Field of Search ............................... 250/397, 370.06, 250/370.01

[56] References Cited

U.S. PATENT DOCUMENTS 4,450,355 5/1984 Mariën et al. .......................... 250/310

5,317,154 5/1994 Honda ..................................... 250/310

FOREIGN PATENT DOCUMENTS 2192091 12/1987 United Kingdom .

*Primary Examiner*—Constantine Hannaher

*Attorney, Agent, or Firm*—Anne E. Barschall

[57] ABSTRACT

A pass-through shutter mechanism enables the semiconductor crystal of an energy dispersive x-ray detector to extend beyond the shutter mechanism for analysis, adjacent to the sample, achieving optimum solid angle collection efficiency. The shutter mechanism provides optimum protection of the semiconductor detector crystal from high energy x-ray or secondary electron events produced in the chambers of electron microscopes, microprobes, x-ray spectrometers, etc.

10 Claims, 2 Drawing Sheets

107
106
102
105
DETECTOR CRYSTAL
103
104
108
SHUTTER DOOR
LINK "C"
SHUTTER TRIGGER
EXTENSION SPRING

MECHANICAL SHUTTER FOR PROTECTING AN X-RAY DETECTOR AGAINST HIGH-ENERGY ELECTRON OR X-RAY DAMAGE

BACKGROUND OF THE INVENTION

A. Field of the Invention

The invention is in the field of x-ray detector systems as used in x-ray producing instrumentation such as electron microscopes, microprobes, x-ray spectrometers, etc. In particular, the invention relates to a device for improving the solid angle of x-ray collection while still providing uncompromised protection for the x-ray detector crystal under conditions of damaging radiation.

B. Related Art

In a system which utilizes an energy dispersive x-ray detector system, such as an electron microscope, a sample is bombarded with an electron beam of up to several hundred thousand electron volts. X-rays and secondary electrons fluoresced by the sample fall incident on the x-ray detector crystal placed in close proximity to the sample. Ideally, the detector needs to be as close as geometrically possible to the sample to obtain the best solid angle of x-ray collection. However, the x-ray detector needs to be protected when excessively high x-ray or secondary electrons are being produced. This occurs, when, for instance, a Transmission Electron Microscope is operating in low magnification mode or when the probe beam is allowed to fall incident on an object which produces high energy x-ray fluorescence. Under these conditions, very high signal currents pass through the detector crystal which causes the electronics in the system to reset at high frequency. This condition may result in detector crystal or electronic component damage.

In the past, when the current in the detector was high, a shutter was placed between the detector crystal and the sample. An example of the prior art appears in British patent GB 2192091A. This prior art has the disadvantage of requiring some distance between the sample and the x-ray detector for the shutter mechanism. Having the detector fixed behind a shutter, which opens or closes, significantly compromises the solid angle of x-ray collection during analysis.

In U.S. Pat. No. 4,450,355, a thin shutter mechanism was controlled by the same magnetic field that controlled the magnification lens. In high magnification, the high magnetic field opens the shutter allowing the detector to measure x-rays from the sample. In low magnification, the shutter remains closed preventing most of the high energy secondary electrons from entering from the detector. This prior art had the disadvantage that there was not sufficient protection of the detector in practice. In particular, when the magnetic field was at some intermediate levels, the shutter stayed open and electrons got to the detector. Also the relatively thin shutter, a fraction of a millimeter of brass, did not adequately stop the very high energy x-rays.

Moreover, in order to allow for space for the shutter mechanism in both of the above patents, the detector had to be positioned at too great a distance from the sample to permit optimal detection.

SUMMARY OF THE INVENTION

The object of the invention is to improve protection of the detector under harmful conditions and reduce the distance between the detector and the sample during analysis.

This object is achieved by pushing the detector past the shutter, adjacent to the specimen, for analysis, and retracting the detector behind the shutter, and closing the shutter, in response to a signal indicating damage to the crystal.

BRIEF DESCRIPTION OF THE DRAWING

The invention will now be described by way of n-limitative example with reference to the following drawings.

DETAILED DESCRIPTION OF THE PREFERRED EMBODIMENTS

Figure 1:
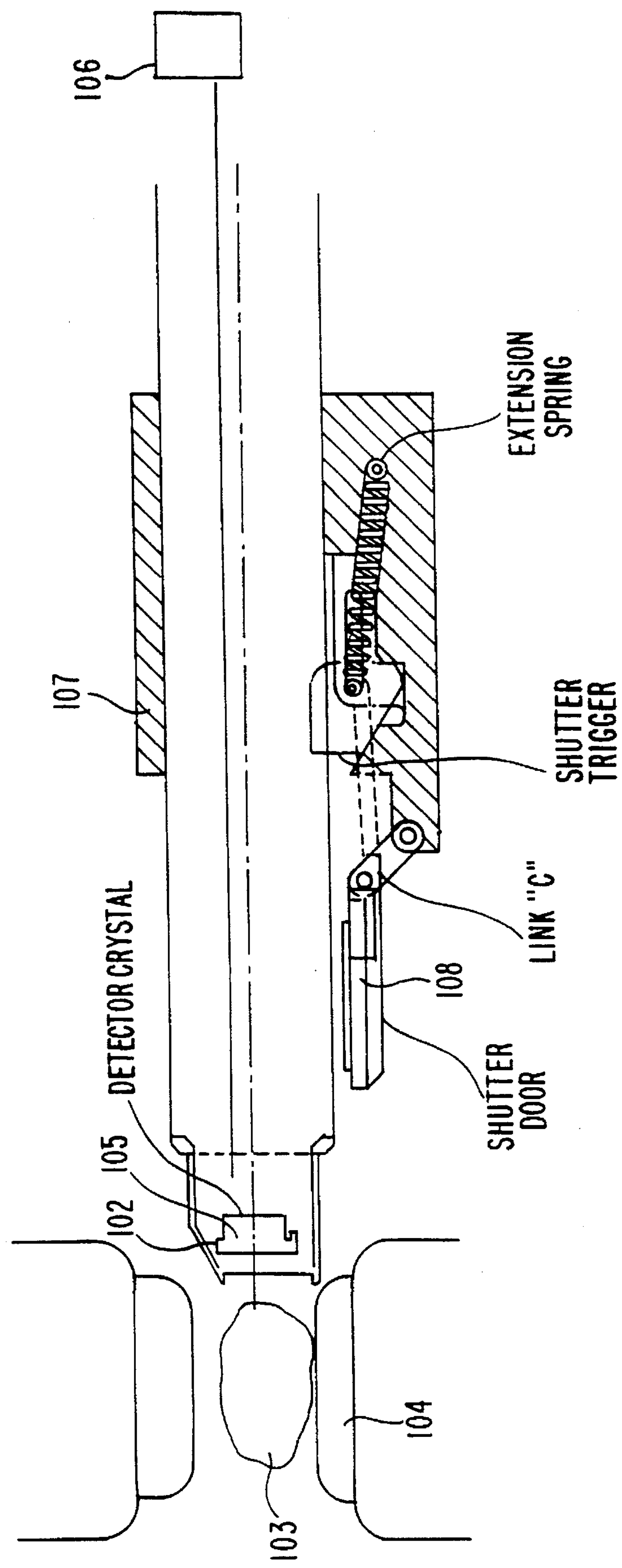
FIG. 1 shows the invention with the detector head in an analyze position.

FIG. 1 shows the detector head 102 in position for detection.

The specimen 103 to be analyzed is located in the microscope chamber of a an electron microscope 104. The specimen 103, upon being bombarded with electrons, emits x-rays which are detected by the detector 105. As shown, during analysis, the detector head 102 is immediately adjacent to the sample 103. Well known circuitry 106 receives electrical signals from the detector 105 and analyzes these signals.

A shutter housing 107 and shutter body 108 are also shown in the figure.

Figure 2:
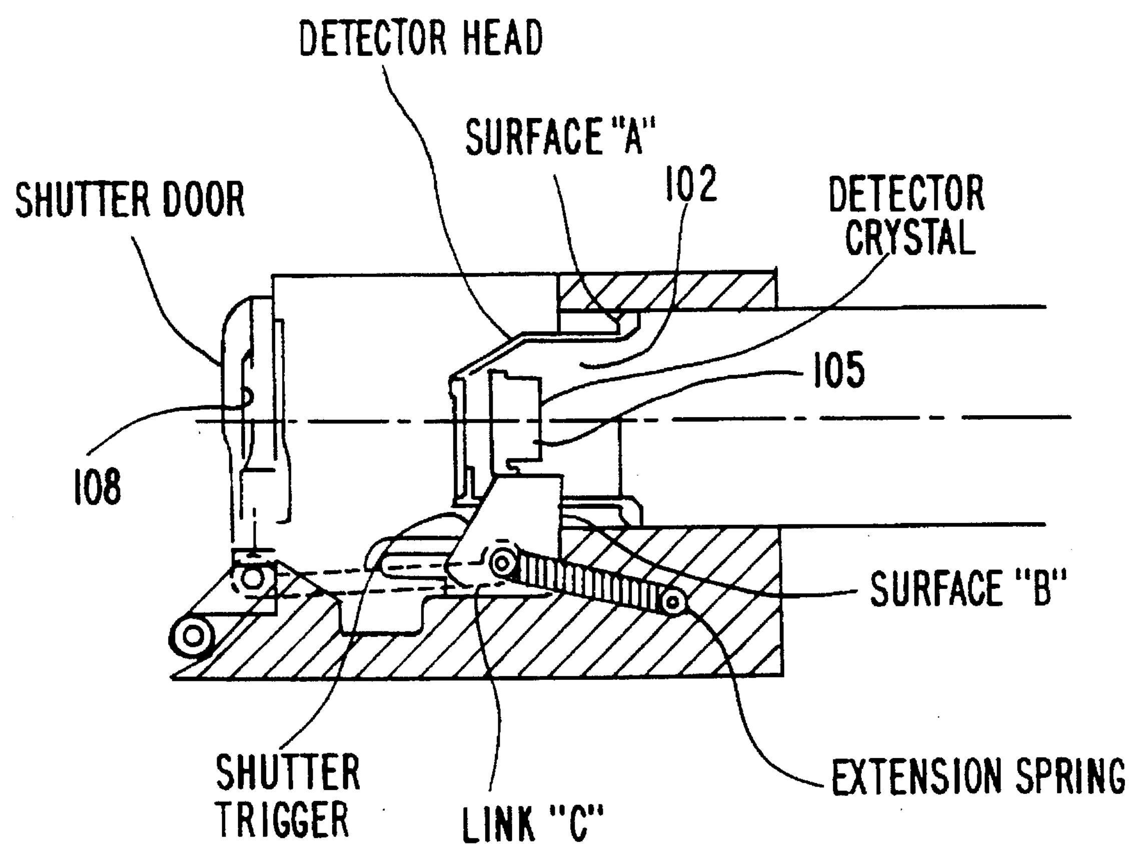
FIG. 2 shows the invention with the detector head in a retracted position.

FIG. 2 shows the shutter in a closed position.

When the detector is not in operation, the detector head 102 is retracted and the shutter is in the closed position. To begin analysis, a slide mechanism moves the detector head forward. In the preferred embodiment, the distance between the closed position and the analyze position 102 is 63.5 mm. As the detector head moves, surface A comes into contact with surface B of the shutter trigger 201. This contact results in the shutter trigger 201 moving forward and opening the shutter door via link c.

When electrons hit the detector, they cause high current in the detector. The detector head is retracted in response to this high current. A similar high current could be caused by a large number of x-rays coming off the specimen but this similar condition also causes retraction, since analysis of such signals is very difficult and such signals may in some cases also damage the detector crystal.

Alternatively, the signals produced by the detector could be analyzed in more detail, for instance using software, to distinguish a characteristic pattern for electrons hitting the detector crystal. The detector could then be retracted in response to that characteristic pattern alone, rather than merely in response to the high current.

The shutter door 108 is hinged at the bottom and is closed by extension spring 203, when the detector head passes on retraction. The shutter door is aluminum with a tungsten layer attached. The tungsten layer should be about 1 millimeter thick and should cover the entire opening in front of the detector. Alternatively, instead of tungsten another x-ray absorbing material may be used. The aluminum part of the shutter is intended to stop the high energy electrons, while the tungsten reduces the number of high energy x-rays that can reach the detector crystal.

We claim:

1. A detector head mechanism for use in an energy dispersive x-ray detector unit comprising:

a) a detector crystal;

b) shutter means for protecting the detector crystal;

c) slidable means for i) pushing the detector crystal through the shutter, into a first position that is adjacent to a specimen, for analysis of the specimen and ii) retracting the detector crystal behind the shutter, into a second position that is more distant from the sample than the first position, in response to a signal from the detector crystal indicating possible harm to the detector crystal, so that the first position is closer to the sample than the shutter and the shutter does not interfere with x-ray detection when the detector crystal is in the first position; and d) means, cooperating with the slidable means, for i) closing the shutter means when the detector crystal is retracted; and ii) opening the shutter means when the detector crystal is pushed through the shutter means for analysis.

2. The mechanism of claim 1 wherein the shutter comprises an x-ray absorbing material.

3. The mechanism of claim 2 is an aluminum door with a tungsten insert.

4. The mechanism of claim 1 wherein the means for closing the shutter means comprises a spring.

5. The mechanism of claim 1 wherein the means for opening the shutter means comprises a shutter trigger actuated by contact with a body containing the detector crystal.

6. Mechanism of claim 5 wherein means for opening the shutter further comprises a spring for closing the shutter when the trigger is deactivated.

7. Mechanism of claim 1 wherein said cooperating is a direct mechanical cooperation between the slidable means and the means for opening.

8. Method for deploying and protecting a detector head mechanism in an energy dispersive x-ray detector unit, the method comprising the steps of pushing a detector crystal through shutter means into a first position adjacent to a specimen to be analyzed, the shutter means not interfering with analysis when the detector crystal is in the first position;

opening the shutter means in response to said pushing;

in response to a signal from the detector crystal indicating possible harm to the crystal, retracting the detector crystal behind the shutter to a second position, which second position is farther from the specimen than the shutter; and closing the shutter means in response to the retracting step.

9. The method of claim 8 wherein said opening is in mechanical response to physical contact between a shutter mechanism and a body moved during said pushing step and wherein said closing is in mechanical response to cessation of said physical contact.

10. The method of claim 8 further comprising the steps of first triggering said opening using a trigger activated by the pushing and second triggering closing when the trigger is deactivated by said retracting.

* * * * *